(12) United States Patent
Yi et al.

(10) Patent No.: US 10,985,015 B2
(45) Date of Patent: Apr. 20, 2021

(54) METHOD FOR PREPARING COMPOSITE MEMBRANE

(71) Applicant: WONIK IPS CO., LTD., Pyeongtaek-si (KR)

(72) Inventors: In Hwan Yi, Suwon-si (KR); Kwang Seon Jin, Incheon (KR); Byung Chul Cho, Hwaseong-si (KR); Jin Sung Chun, Seongnam-si (KR)

(73) Assignee: WONIK IPS CO., LTD., Pyeongtaek-si (KR)

( * ) Notice: Subject to any disclaimer, the term of this patent is extended or adjusted under 35 U.S.C. 154(b) by 0 days.

(21) Appl. No.: 16/339,794

(22) PCT Filed: Sep. 28, 2017

(86) PCT No.: PCT/KR2017/010779
§ 371 (c)(1),
(2) Date: Apr. 5, 2019

(87) PCT Pub. No.: WO2018/066884
PCT Pub. Date: Apr. 12, 2018

(65) Prior Publication Data
US 2020/0043718 A1    Feb. 6, 2020

(30) Foreign Application Priority Data

Oct. 6, 2016 (KR) .................. 10-2016-0129049
Nov. 3, 2016 (KR) .................. 10-2016-0145752
Sep. 22, 2017 (KR) .................. 10-2017-0122362

(51) Int. Cl.
*H04L 21/02* (2006.01)
*H01L 21/02* (2006.01)
(Continued)

(52) U.S. Cl.
CPC .... *H01L 21/0228* (2013.01); *C23C 16/45542* (2013.01); *H01L 21/022* (2013.01);
(Continued)

(58) Field of Classification Search
CPC .......... H01L 21/02211; H01L 21/0332; H01L 21/768; H01L 21/02186; H01L 21/0228;
(Continued)

(56) References Cited

U.S. PATENT DOCUMENTS

2011/0130011 A1* 6/2011 Sasajima ........... H01L 21/02244
438/770
2016/0336178 A1* 11/2016 Swaminathan ..... H01L 21/0332
2018/0083115 A1* 3/2018 Clifton .............. H01L 29/66643

FOREIGN PATENT DOCUMENTS

JP    2001267566 A    9/2001
JP    2009206339 A    9/2009
(Continued)

*Primary Examiner* — Thanh T Nguyen
(74) *Attorney, Agent, or Firm* — William Park & Associates Ltd.

(57) ABSTRACT

Disclosed is a technology relating to a method for fabricating a multilayer structure. In the method for fabricating the multilayer structure according to the disclosed embodiment, a first material layer including at least one atomic layer is deposited using a first source gas, which includes a first component, and an oxygen-containing reactive gas which is reactive with the first source gas. On the first material layer, a second material layer including at least one atomic layer is deposited using a second source gas, which includes a second component different from the first component, and an oxygen-containing reactive gas which is reactive with the second source gas. The step of depositing the first material layer and the step of depositing the second material layer constitute one cycle, and the cycle is performed at least once.

16 Claims, 12 Drawing Sheets

(51) Int. Cl.
  *C23C 16/455* (2006.01)
  *H01L 21/033* (2006.01)
(52) U.S. Cl.
  CPC .. *H01L 21/02164* (2013.01); *H01L 21/02186* (2013.01); *H01L 21/02189* (2013.01); *H01L 21/02205* (2013.01); *H01L 21/02211* (2013.01); *H01L 21/02274* (2013.01); *H01L 21/0332* (2013.01); *H01L 21/0337* (2013.01)
(58) Field of Classification Search
  CPC ............ H01L 21/02205; H01L 21/324; H01L 21/02189; H01L 21/28; H01L 21/02274; H01L 21/02219; H01L 21/0337; H01L 21/022; H01L 21/02164; C23C 16/45542
  See application file for complete search history.

(56) References Cited

FOREIGN PATENT DOCUMENTS

| | | | |
|---|---|---|---|
| JP | 2012142367 | A | 7/2012 |
| JP | 2016119343 | A | 6/2016 |
| KR | 1020010082118 | A | 8/2001 |
| KR | 1020050062132 | A | 6/2005 |
| KR | 1020060041355 | A | 5/2006 |
| KR | 1020060041963 | A | 5/2006 |
| KR | 100640654 | B1 | 11/2006 |
| KR | 1020120001778 | A | 1/2012 |
| KR | 1020160062487 | A | 6/2016 |

\* cited by examiner

METHOD FOR PREPARING COMPOSITE MEMBRANE

TECHNICAL FIELD

The present invention relates to a method for fabricating a semiconductor device, and more particularly, to a method for fabricating a multilayer structure which is applied to a semiconductor device.

BACKGROUND ART

In a highly integrated semiconductor device, a dielectric layer may perform various functions in addition to the fundamental function of providing electrical insulation between conductive layers.

This dielectric layer may have a monolayer or multilayer structure, and is applied to various fields, including a hard mask, a spacer for forming a fine pattern, or an etch stopper which is used in an etching process, in addition to the fundamental function of providing electrical insulation between conductive layers.

In order to perform these various functions, the dielectric layer should be easily adjustable in terms of its dielectric characteristics, hardness characteristics, roughness characteristics, etch selectivity characteristics and thickness uniformity, according to its intended use.

DISCLOSURE

Technical Problem

A problem to be solved by the present invention is to provide a method for fabricating a multilayer structure capable of performing various functions.

Technical Solution

A method for fabricating a multilayer structure according to an embodiment of the present invention includes the steps of: depositing a first material layer including at least one atomic layer by using a first source gas, which includes a first component, and an oxygen-containing reactive gas which is reactive with the first source gas; and depositing, on the first material layer, a second material layer including at least one atomic layer by using a second source gas, which includes a second component different from the first component, and an oxygen-containing reactive gas which is reactive with the second source gas, wherein the step of depositing the first material layer and the step of depositing the second material layer constitute one deposition cycle, and the deposition cycle is performed at least once.

Advantageous Effects

According to the present invention, a multilayer structure having all desired surface roughness, etch selectivity and thickness uniformity may be fabricated.

BEST MODE

Figure 1A:
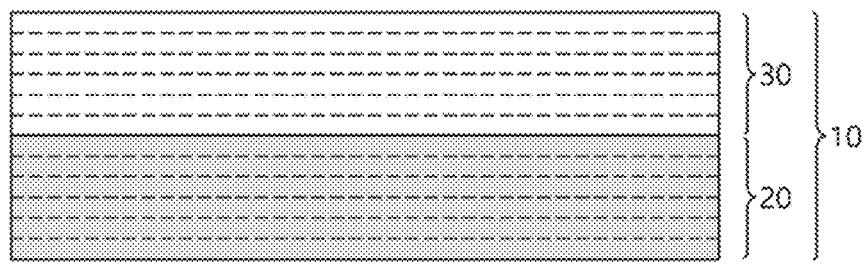
FIGS. 1A to 1D are sectional views showing various multilayer structures according to an embodiment of the present invention.

The advantages and features of the present invention, and the way of attaining them, will become apparent with reference to the exemplary embodiments described below in detail in conjunction with the accompanying drawings. However, the present invention is not limited to the exemplary embodiments disclosed below and can be embodied in a variety of different forms; rather, these embodiments are provided so that this disclosure will be thorough and complete, and will fully convey the scope of the present invention to those skilled in the art. The scope of the present invention will be defined by the appended claims. In the drawings, the sizes and relative sizes of layers and regions may be exaggerated for clarity of explanation. Like reference numerals refer to like elements throughout the specification.

FIGS. 1a to 1d are sectional views showing various multilayer structures according to an embodiment of the present invention.

Referring to FIG. 1a, a multilayer structure 10 may include a first material layer 20 and a second material layer 30.

The first material layer 20 may include a first component and an oxygen component. Here, the first component may include, for example, one selected from among zirconium (Zr), silicon (Si) and titanium (Ti). Accordingly, the first material layer 20 may be a zirconium oxide ($ZrO_2$), silicon oxide ($SiO_2$) or titanium oxide ($TiO_2$) layer. The first material layer 20 may include at least one thin layer (hereinafter referred to as atomic layer). At least one atomic layer of the first material layer 20 may be formed by any one of a thermal atomic layer deposition (ALD) method, a plasma-enhanced deposition (PEALD) method, and a combination thereof.

On the first material layer 20, the second material layer 30 may be formed. The second material layer 30 may include a second component and an oxygen component. The second component may be a material different from the first component. For example, if the first component is zirconium (Zr), the second component may be titanium (Ti). In addition, if the first component is silicon (Si), the second component may be titanium (Ti). In addition, if the first component is titanium (Ti), the second component may be zirconium (Zr) or silicon (Si). This second material layer 30 may also include at least one atomic layer.

For example, as shown in FIG. 1a, the first and second material layers 20 and 30 of the multilayer structure 10 may each be composed of a plurality of atomic layers.

Figure 1B:
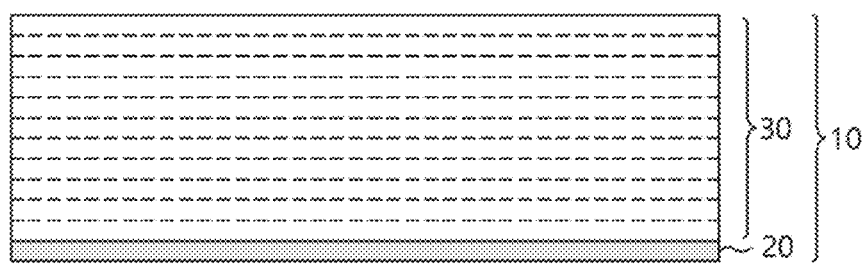

Furthermore, as shown in FIG. 1b, the first material layer 20 of the multilayer structure 10 may be composed of a single atomic layer, and the second material layer 30 may be composed of a plurality of atomic layers.

Figure 1C:
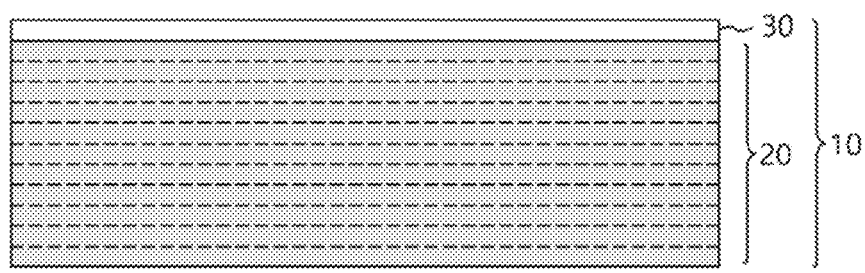

In addition, as shown in FIG. 1c, the first material layer 20 of the multilayer structure 10 may be composed of a plurality of atomic layers, and the second material layer 30 may be composed of a single atomic layer.

Figure 1D:
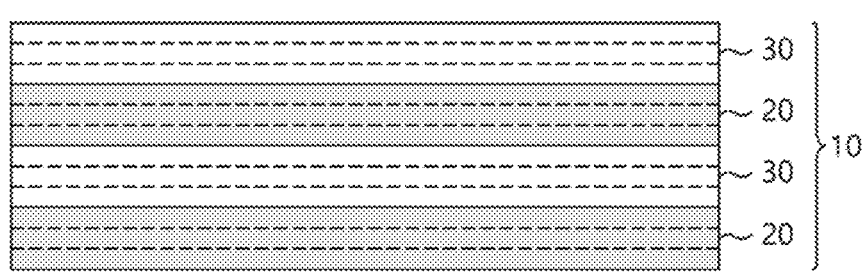

The first and second material layers 20 and 30, each including at least one atomic layer as shown in FIGS. 1a to 1c, may be alternately deposited at least once to form the multilayer structure 10 as shown in FIG. 1d.

Figure 2:
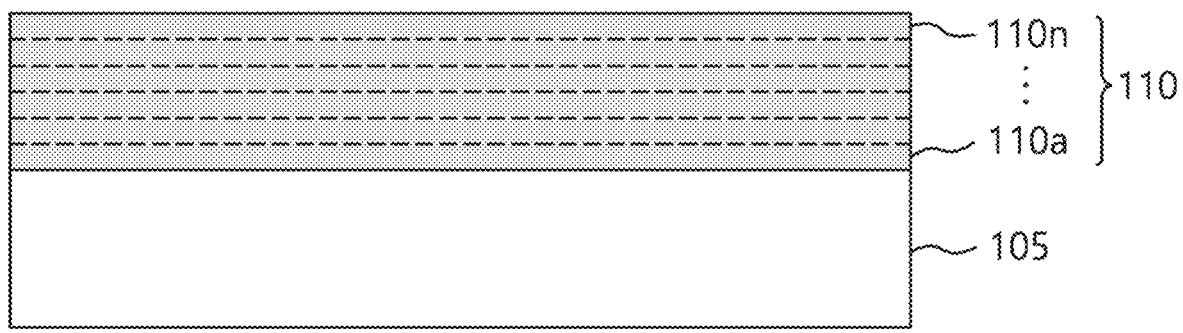
FIG. 2 is a sectional view illustrating a method of fabricating a first material layer according to an embodiment of the present invention.

FIG. 2 is a sectional view illustrating a method of fabricating a first material layer according to an embodiment of the present invention.

A first material layer 110 may be formed on a base layer 105. Here, the base layer 105 may be a bare semiconductor substrate, a device layer, a dielectric layer, a conductive layer, or an etching target layer to be etched. As described above, the first material layer 110 may include one or more atomic layers 110a to 110n which include a first component and an oxygen component. In addition, as described above, zirconium (Zr), silicon (Si) or titanium (Ti) may be used as the first component. The one or more atomic layers 110a to 110n may be formed by, for example, atomic layer deposition (hereinafter referred to as ALD) or plasma-enhanced atomic layer deposition (hereinafter referred to as PEALD). At this time, the PEALD may be continuous wave (CW) plasma deposition or pulsed PEALD.

Figure 3A:
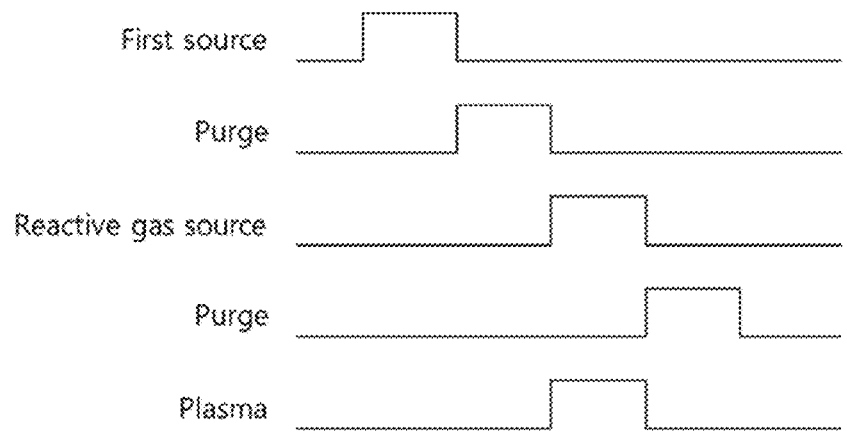
FIGS. 3A to 3C are timing views showing a process cycle for forming an atomic layer of a first material layer according to an embodiment of the present invention.
Figure 3B:
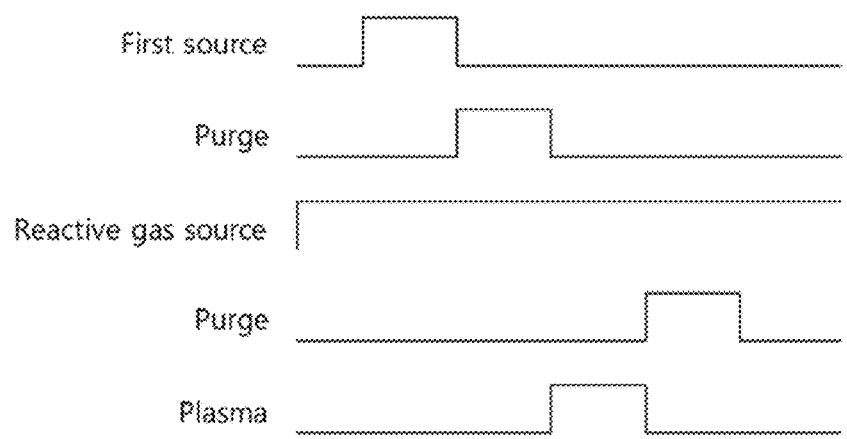
Figure 3C:
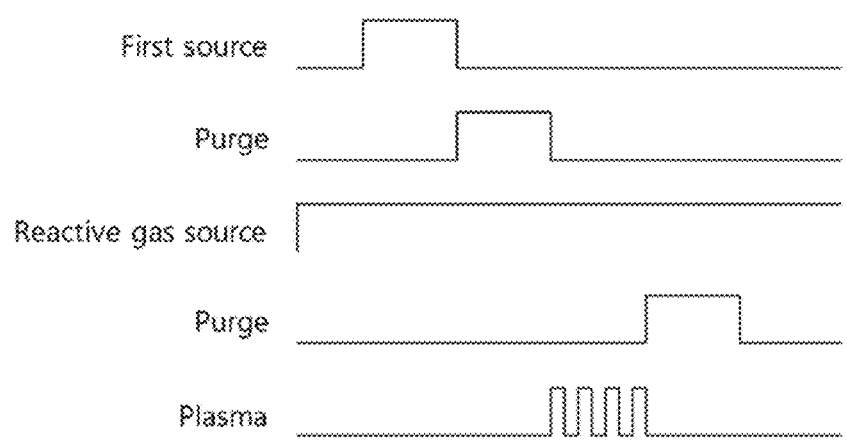

FIGS. 3a to 3c are timing views showing a process cycle for forming an atomic layer of a first material layer according to an embodiment of the present invention.

Referring to FIG. 3a, a first source including a first component is supplied for a predetermined time, thereby adsorbing the atoms of the first component onto an underlying layer. Here, the underlying layer may be, for example, the base layer 105 or a previously formed first atomic layer.

If the first component is zirconium (Zr), a Cp-Zr (cyclopentadienyl tris(dimethylamino)zirconium; formula: CpZr$[N(CH_3)_2]_3$), ethylcyclopentadienyl tris(ethylmethylamino) zirconium (formula: $((C_2H_5)C_5H_4)Zr[N(CH_3)C_2H_5]_3$), TEMA-Zr (tetrakis(ethylmethylamino)zirconium; formula: Zr$[N(CH_3)(C_2H_5)]_4$), or $ZrCl_4$ (zirconium tetrachloride) source may be used as the first source.

If the first component is silicon (Si), a BDEAS (bis (diethylamino)silane; formula: $H_2Si[N(C_2H_5)_2]_2$), 3DMAS (tris(dimethylamino)silane; formula: HSi$[N(CH_3)_2]_3$), 4DMAS (tetrakis(dimethylamino)silane; formula: Si[N$(CH_3)_2]_4$) or DIPAS (di(isoprophylamino)silane; formula: $H_3Si[N(C_3H_7)]$) source may be used as the first source.

In addition, if the first component is titanium (Ti), a CP—Ti (tetrakis(dimethylamino)titanium; formula: Ti[N$(CH_3)_2]_4$), TEMA-Ti (tetrakis(ethylmethylamino)titanium; formula: Ti$[N(CH_3)(C_2H_5)]_4$), TTIP (titanium tetraisopropoxide; formula: Ti$[O(CH(CH_3)_2)]_4$), $TiCl_4$ (titanium tetrachloride) or TDMAT (tetrakis(dimethylamino)titanium; formula: Ti$[N(CH_3)_2]_4$) source may be used as the first source.

Next, the atoms of the first component, not adsorbed onto the underlying layer, are removed by a purge process.

Thereafter, a reactive gas source for reacting with the atoms of the first component is supplied for a predetermined time. As the reactive gas source, an $O_2$ source, an $H_2O$ source or an $O_3$ source may be used. More specifically, for PEALD, an $O_2$ source may be used as the reactive gas source, and for thermal ALD, an $H_2O$ source or an $O_3$ source may be used as the reactive gas source. The atoms of the reactive gas source may react with the atoms of the first component, adsorbed onto the underlying layer as described above.

Thereafter, a purge process is performed to remove unreacted oxygen atoms, thereby forming first atomic layers 110a to 110n including the first component and the oxygen component. Namely, for each of the first atomic layers 110a to 110n, the sequential steps of supplying the first source, purging, supplying the reactive gas source, and purging, may constitute a process cycle for forming a single first atomic layer. In addition, the process cycle may be repeatedly performed at least once to form the first material layer 110 including a plurality of atomic layers.

In some cases, as shown in FIG. 3b, the reactive gas source may be continuously supplied throughout the deposition cycle.

In addition, as shown in FIGS. 3a and 3b, plasma may be applied during the process cycle. The plasma may be supplied continuously during the period in which the atoms of the first source substantially react with the reactive gas source.

Meanwhile, as shown in FIG. 3c, the plasma may also be supplied as a plurality of pulses during the period in which the atoms of the first source substantially react with the reactive gas source. This method is referred to as a pulsed PEALD method.

This first material layer 110 may be formed to have a laminate structure by repeating at least once the process of forming each of the first atomic layers 110a to 110n as described above.

Figure 4:
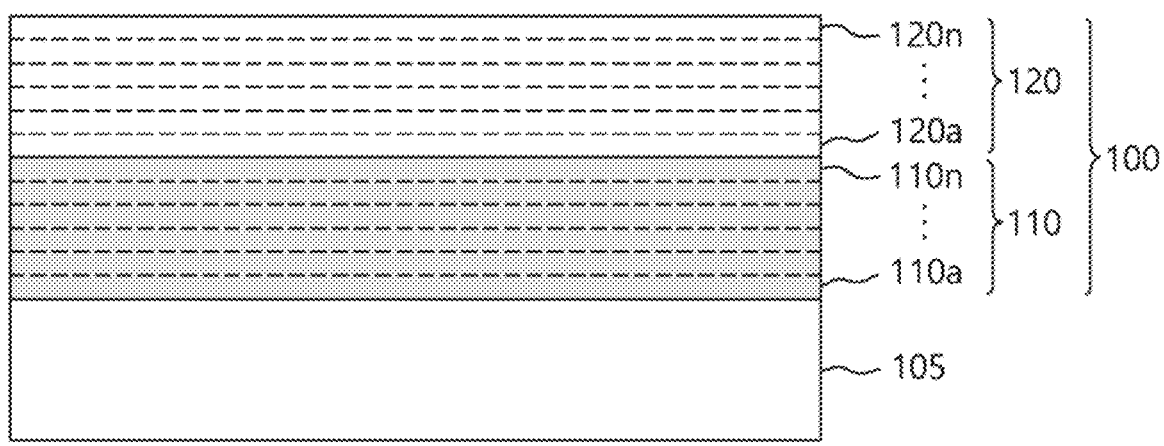
FIG. 4 is a sectional view of a semiconductor device, which illustrates a method of fabricating a second material layer on a first material layer according to an embodiment of the present invention.

FIG. 4 is a sectional view of a semiconductor device, which illustrates a method of fabricating a second material layer on the first material layer according to an embodiment of the present invention.

As shown in FIG. 4, a second material layer 120 is formed on the first material layer 110, thereby forming a multilayer structure 100. The second material layer 120 may include: a second component different from the first component of the first material layer 110; and an oxygen component. For example, if the first component is zirconium (Zr), the second material layer 120 may include titanium (Ti) as the second component, and if the first component is silicon (Si), the second material layer 120 may include titanium (Ti) as the second component, and if the first component is titanium (Ti), the second material layer 120 may include zirconium (Zr) or silicon (Si) as the second component.

The second material layer 120 also includes one or more atomic layers (hereinafter referred to as second atomic layers 120a to 120n), like the first material layer 110. The second atomic layers 120a to 120n may also be formed by an ALD method, a thermal ALD method, a PEALD method or a pulsed PEALD method.

Figure 5A:
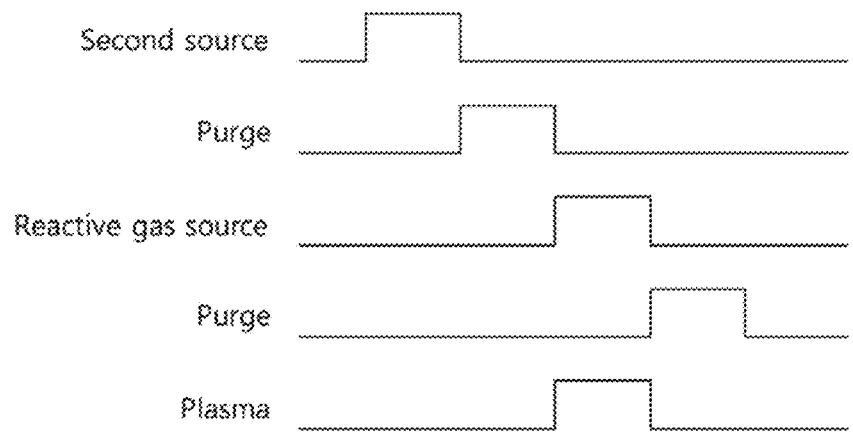
FIGS. 5A to 5C are timing views showing a process cycle for forming an atomic layer of a second material layer according to an embodiment of the present invention.
Figure 5B:
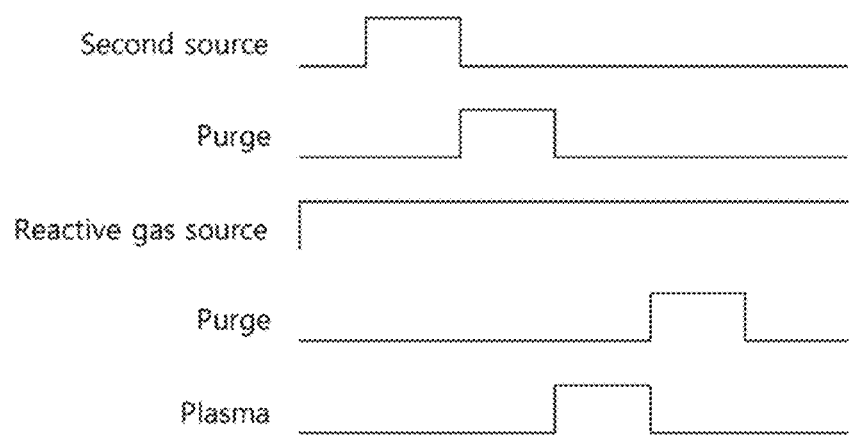
Figure 5C:
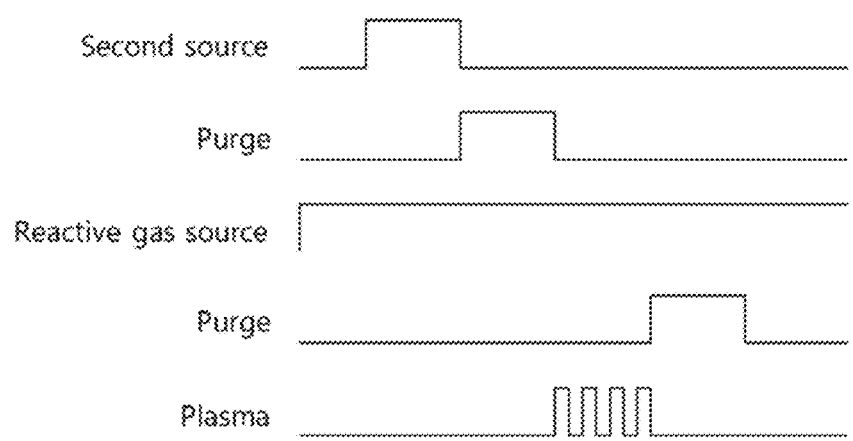

FIGS. 5a to 5c are timing views showing a process cycle for forming an atomic layer of a second material layer according to an embodiment of the present invention.

Referring to FIG. 5A, a second source is first supplied for a predetermined time, thereby adsorbing the atoms of the second component onto an underlying layer. The underlying layer may be the first material layer 110 or one of previously deposited second atomic layers 120a to 120n.

Here, if the second component is titanium (Ti), a CP—Ti (tetrakis(dimethylamino)titanium; formula: $Ti[N(CH_3)_2]_4$), TEMA-Ti (tetrakis(ethylmethylamino)titanium; formula: $Ti[N(CH_3)(C_2H_5)]_4$), TTIP (titanium tetraisopropoxide; formula: $Ti[O(CH(CH_3)_2)]_4$), $TiCl_4$ (titanium tetrachloride) or TDMAT (tetrakis(dimethylamino)titanium; formula: $TI[N(CH_3)_2]_4$) source may be used as the second source.

If the second component is zirconium, a Cp-Zr (cyclopentadienyl tris(dimethylamino)zirconium; formula: $CpZr[N(CH_3)_2]_3$), ethylcyclopentadienyl tris(ethylmethylamino)zirconium (formula: $((C_2H_5)C_5H_4)Zr[N(CH_3)C_2H_5]_3$), TEMA-Zr (tetrakis(ethylmethylamino)zirconium; formula: $Zr[N(CH_3)(C_2H_5)]_4$), or $ZrCl_4$ (zirconium tetrachloride) source may be used as the second source.

If the second component is silicon, a BDEAS (bis(diethylamino)silane; formula: $H_2Si[N(C_2H_5)_2]_2$), 3DMAS (tris(dimethylamino)silane; formula: $HSi[N(CH_3)_2]_3$), 4DMAS (tetrakis(dimethylamino)silane; formula: $Si[N(CH_3)_2]_4$) or DIPAS (di(isoprophylamino)silane; formula: $H_3Si[N(C_3H_7)]$) source may be used as the second source.

Next, unreacted atoms of the second component are removed by a purge step.

Thereafter, a reactive gas source is supplied for a predetermined time. As the reactive gas source, an $O_2$ source, an $H_2O$ source or an $O_3$ source may be used. In a manner similar to the method of depositing the first material layer 110, an $O_2$ source may be used as the reactive gas source, and for thermal ALD, an $H_2O$ source or an $O_3$ source may be used as the reactive gas source.

The atoms of the reactive gas source react with the atoms of the second component, adsorbed onto the underlying layer.

Thereafter, unreacted oxygen atoms are removed by a purge process, thereby forming the second atomic layers 120a to 120n having the second component and the oxygen component. Namely, for each of the second atomic layers 120a to 120n, the sequential steps of supplying the second source, purging, supplying the reactive gas source, and purging, may constitute a process cycle for forming a single second atomic layer. In addition, the process cycle may be repeatedly performed at least once, thereby forming the first material layer 120 including a plurality of atomic layers.

In some cases, as shown in FIG. 5b, the reactive gas source may be continuously supplied throughout the deposition cycle.

In addition, as shown in FIGS. 5a and 5b, plasma may be applied during the process cycle. The plasma may be supplied continuously during the period in which the atoms of the first source substantially react with the reactive gas source.

Meanwhile, as shown in FIG. 5c, the plasma may also be supplied as a plurality of pulses during the period in which the atoms of the second source substantially react with the reactive gas source.

The second material layer 120 may also be formed to have a laminate structure by repeating at least once the process of forming each of the second atomic layers 120a to 120n.

In addition, for the multilayer structure 100 of this embodiment, the step of forming the first material layer 110 composed of one or more first atomic layers 110a to 110n, and the step of forming the second material layer 120 composed of one or more second atomic layers 120a to 120n, may constitute one deposition cycle, and the deposition cycle may be repeatedly performed at least once, thereby forming the multilayer structure 100.

Furthermore, the first material layer 110 and second material layer 120 according to the embodiment of the present invention are formed by an ALD-based deposition method, and hence may be deposited at low temperature, for example, a temperature of 50 to 300° C. In some cases, if highly pyrolytic TDMAT (tetrakis(dimethylamino)titanium; formula: $Ti[N(CH_3)_2]_4$) is used as a titanium source, it is preferably deposited at a temperature of 250° C. or below.

Figure 6A:
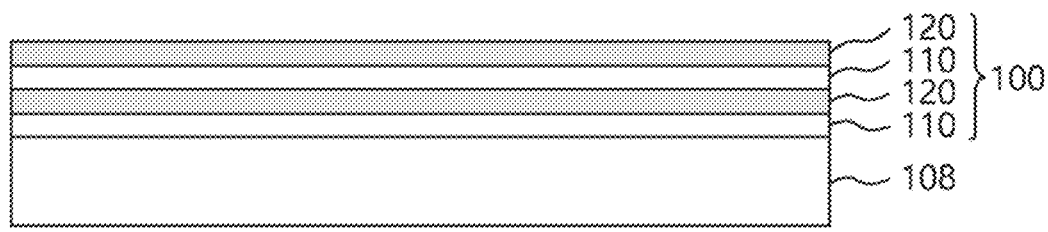
FIGS. 6A to 6C are sectional views showing examples to which a multilayer structure according to an embodiment of the present invention is applied.
Figure 6B:
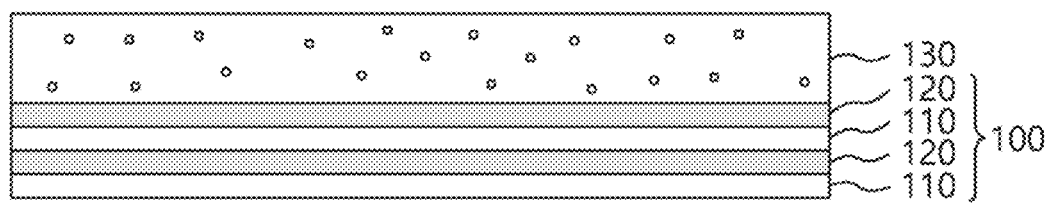
Figure 6C:
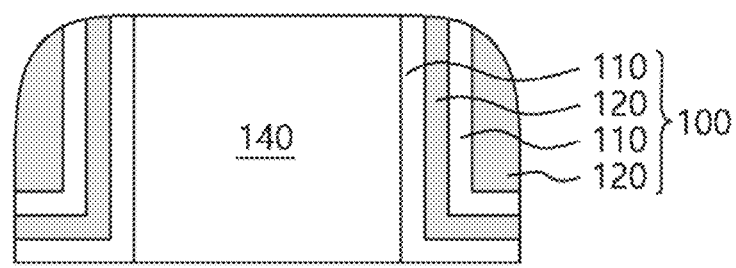

FIGS. 6a to 6c are sectional views showing examples to which a multilayer structure according to an embodiment of the present invention is applied.

As shown in FIG. 6a, a first material layer 110 and a second material layer 120, each including one or more atomic layers, may be alternately deposited on an etching target layer 108, thereby forming a multilayer structure 100. After the multilayer structure 100 is formed on the etching target layer 108, it may be patterned in a predetermined shape. Thereafter, the etching target layer 108 may be etched in a predetermined shape by using the multilayer structure 100 as a hard mask.

As shown in FIG. 6b, an etching target layer 130 may be formed on a multilayer structure 100 formed by alternately depositing a first material layer 110 and a second material layer 120. Then, in a process in which the etching target layer 130 is blanket-etched or patterned in a predetermined shape, the multilayer structure 100 may be used as an etch stopper due to a difference in etch selectivity from the etching target layer 130.

In addition, as shown in FIG. 6c, a multilayer structure 100 formed by alternately depositing a first material layer 110 and a second material layer 120 may be formed on the sidewall of a pattern 140 and used as a spacer.

The content ratio between the first component and the second component in the multilayer structure 100 may be adjusted by changing the number of the deposited first atomic layers 110a to 110n of the first material layer 110 and the number of the deposited second atomic layers 120a to 120n of the second material layer 120.

Figure 7:
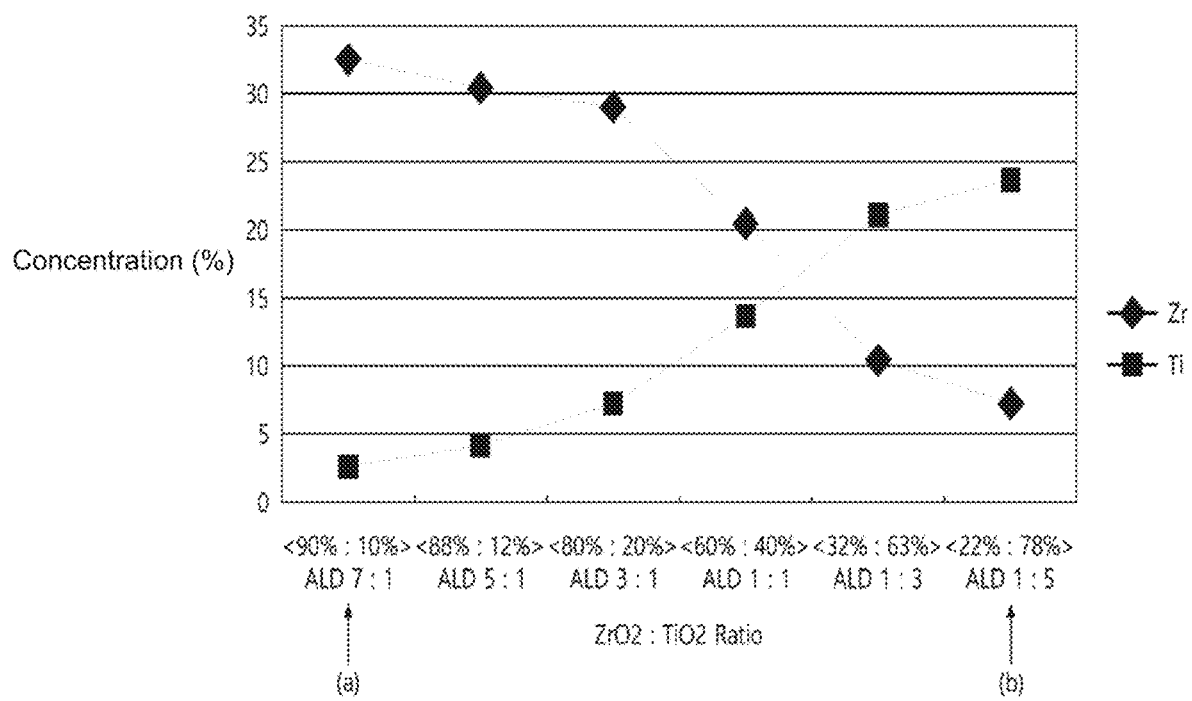
FIG. 7 is a graph showing a change in the content ratio between a first component and a second component as a function of the number of first and second atomic layers according to an embodiment of the present invention.

FIG. 7 is a graph showing a change in the content ratio between a first component and a second component as a function of the number of first and second atomic layers according to an embodiment of the present invention.

For example, FIG. 7 is a graph showing the results obtained when the first material layer is a zirconium oxide ($ZrO_2$) layer and the second material layer is a titanium oxide ($TiO_2$) layer.

As shown in FIG. 7, when a zirconium oxide ($ZrO_2$) layer corresponding to the first material layer 110 was composed of 7 atomic layers and a titanium oxide ($TiO_2$) layer corresponding to the second material layer 120 was composed of a single atomic layer, the content ratio between the first component (Zr) and the second component (Ti) in the multilayer structure 100 was 90%:10% (a). Here, it is to be understood that the content ratio between the first component (Zr) and the second component (Ti) is a ratio obtained when the sum of the first component and the second component is taken as 100% while the proportion of the oxygen component in the multilayer structure is eliminated. Hereinafter, the content ratio between the first and second components will refer to the ratio obtained when the sum of the first component and the second component is taken as 100% while the oxygen component is eliminated.

Meanwhile, when a zirconium oxide ($ZrO_2$) layer corresponding to the first material layer 110 was composed of a single atomic layer and a titanium oxide ($TiO_2$) layer corresponding to the second material layer 120 was composed of 5 atomic layers, the content ratio between the first component (zirconium) and the second component (titanium) in the multilayer structure 100 was observed to be 22%:78% (b).

Namely, from the experimental results shown in FIG. 7, it can be seen that as the number of deposited atomic layers increases, the proportion of the component of the corresponding material layer increases.

Tables 1 and 2 below show the roughness characteristics of multilayer structures according to embodiments of the present invention. Here, Table 1 shows an example in which a zirconium oxide ($ZrO_2$) layer is used as the first material layer and a titanium oxide ($TiO_2$) layer is used as the second material layer. Table 2 shows an example in which a silicon oxide ($SiO_2$) layer is used as the first material layer and a titanium oxide ($TiO_2$) layer is used as the second material layer.

TABLE 1

| | $ZrO_2$ | $ZrO_2:TiO_2$ | $ZrO_2:TiO_2$ | $ZrO_2:TiO_2$ | $ZrO_2:TiO_2$ | $ZrO_2:TiO_2$ | $ZrO_2:TiO_2$ | $ZrO_2:TiO_2$ | $ZrO_2:TiO_2$ | $TiO2$ |
|---|---|---|---|---|---|---|---|---|---|---|
| Zr:Ti (%) | 100:0 | 90:10 | 88:12 | 80:20 | 60:40 | 32:68 | 22:78 | 13:87 | 7:93 | 0:100 |
| Surfaces roughness (Rq, Å) | 0.603 | 0.151 | 0.152 | 0.183 | 0.125 | 0.133 | 0.155 | 0.129 | 0.143 | 0.269 |

As shown in Table 1 above, the roughness (Rq) of the zirconium oxide layer ($ZrO_2$: 100%) composed of only zirconium (Zr)-oxygen ($O_2$) components was measured as 0.603 Å, and the roughness (Rq) of the titanium oxide layer ($TiO_2$: 100%) composed of only titanium (Ti)-oxygen ($O_2$) components was measured as 0.269 Å.

On the other hand, the surface roughnesses (Rq) the multilayer structures (Zr: Ti=90% to 7%: 10% to 93%), which had a laminate structure and in which the zirconium oxide ($ZrO_2$) layer and the titanium oxide ($TiO_2$) layer were alternately deposited, were measured to range from 0.151 to 0.143 Å.

From the above-described results, it can be seen that the surface roughness is better when the zirconium oxide ($ZrO_2$) layer and the titanium oxide ($TiO_2$) layer are deposited to form the multilayer structure 100 than when the zirconium oxide ($ZrO_2$) layer or the titanium oxide ($TiO_2$) layer is separately used.

oxide layer and the titanium oxide layer was observed to be 0.122 to 0.191 Å, which is better than that observed when the titanium oxide layer ($TiO_2$: 100%) was used alone.

In particular, as shown in Table 2 above, it can be seen that the multilayer structure formed by depositing the silicon oxide ($SiO_2$) layer and the titanium oxide ($TiO_2$) layer has stable surface roughness characteristics when the content ratio between the silicon oxide ($SiO_2$) layer and the titanium oxide ($TiO_2$) layer is in the range of 70%:30% to 20%:80%.

Although the roughness of the multilayer structure 100 as described above is of course important even when the multilayer structure is applied as a common dielectric layer, the roughness becomes a more important factor when the multilayer structure is applied as a spacer. Currently, a line width smaller than the exposure limit is required for a mask pattern, and for this reason, if the surface of a mask layer is irregular, not only it will be difficult to define a pattern having a desired shape, but also even the roughness portion may contribute to the line width of the pattern. Therefore, if the multilayer structure is used as a mask layer for fabricating a fine pattern, it will be important to adjust the first and second components so that the multilayer structure will have low roughness (0 to 2 Å).

Figure 8:
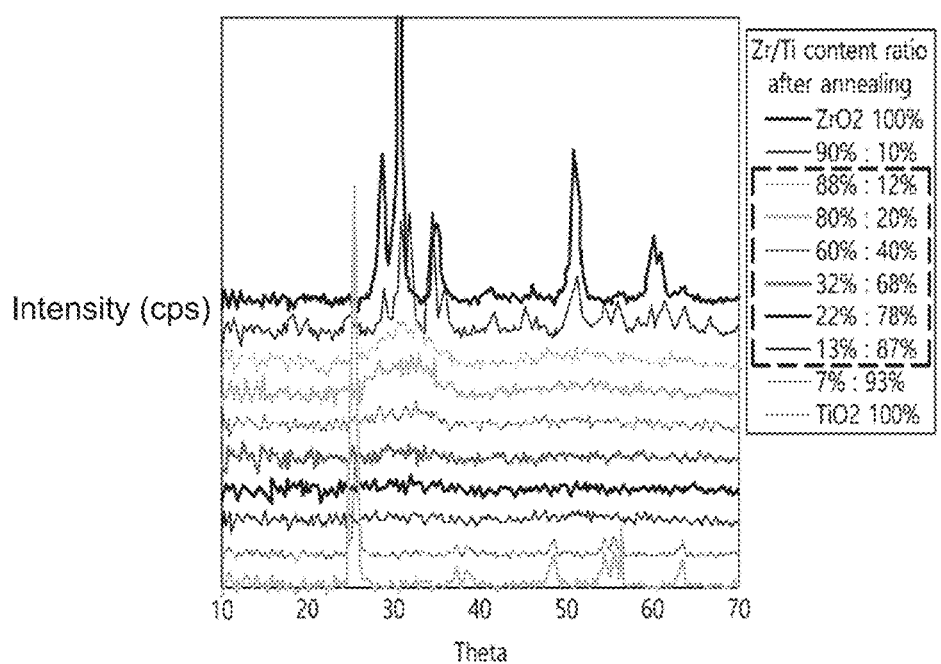
FIG. 8 is a graph showing changes in the crystallinity of multilayer structures according to an embodiment of the present invention.

FIG. 8 is a graph showing changes in the crystallinity of multilayer structures according to an embodiment of the present invention. FIG. 8 shows changes in intensity after annealing of multilayer structures having various content ratios. The experiment shown in FIG. 8 was performed using a zirconium oxide ($ZrO_2$) layer as a first material layer and a titanium oxide ($TiO_2$) layer as a second material layer. In addition, the annealing process was performed, for example, at a pressure of 2 Torr at a temperature of 400° C. for 30 minutes in a state in which about 2000 sccm of Ar gas was supplied. The annealing process in this experiment may correspond to an additional process for providing the same conditions as those of a subsequent process, and is performed in order to examine whether or not the properties of the multilayer structure are variable due to an additional annealing process which is performed during the subsequent process after forming the multilayer structure.

Referring to FIG. 8, in the case in which the titanium oxide ($TiO_2$) layer was used alone, it was observed that the titanium oxide ($TiO_2$) layer changed suddenly to a crystalline form in the range of 20 to 30 theta. Similarly, in the case in which the zirconium oxide ($ZrO_2$) layer was alone, it was observed that the zirconium oxide ($ZrO_2$) layer also changed suddenly to a crystalline form in the range of 30 to 40 theta.

On the other hand, in the case in which the multilayer structure was formed by depositing the zirconium oxide

TABLE 2

| | $SiO_2$ | $SiO_2:TiO_2$ | $SiO_2:TiO_2$ | $SiO_2:TiO_2$ | $SiO_2:TiO_2$ | $SiO_2:TiO_2$ | $TiO_2$ |
|---|---|---|---|---|---|---|---|
| Content ratio | 100% | 70%:30% | 50%:50% | 40%:60% | 30%:70% | 20%:80% | 100% |
| Surface roughness (Rq) | 0.136 | 0.133 | 0.134 | 0.122 | 0.178 | 0.191 | 0.269 |

Similarly, as shown in Table 2 above, the surface roughness of the multilayer structure composed of the silicon layer and the titanium oxide layer and the content ratio between zirconium (Zr) and titanium (Ti) in the multilayer structure was in the range of 88 to 13%:12% to 87%, it was observed that no crystallization occurred (no sudden increase in intensity occurred), in other words, the multilayer has an amorphous state.

This suggests that crystallization properties of the multilayer structure including both the zirconium oxide ($ZrO_2$) layer and the titanium oxide ($TiO_2$) layer are better than those of the layer structure including the zirconium oxide ($ZrO_2$) layer alone or the titanium oxide ($TiO_2$) layer alone.

From the above-described experiment, it was observed that the crystallinity of the multilayer structure changed depending on the content ratio between the first and second components included in the multilayer structure, suggesting that the surface roughness of the multilayer structure can be controlled depending on the content ratio between the components of the multilayer structure.

Figure 9:
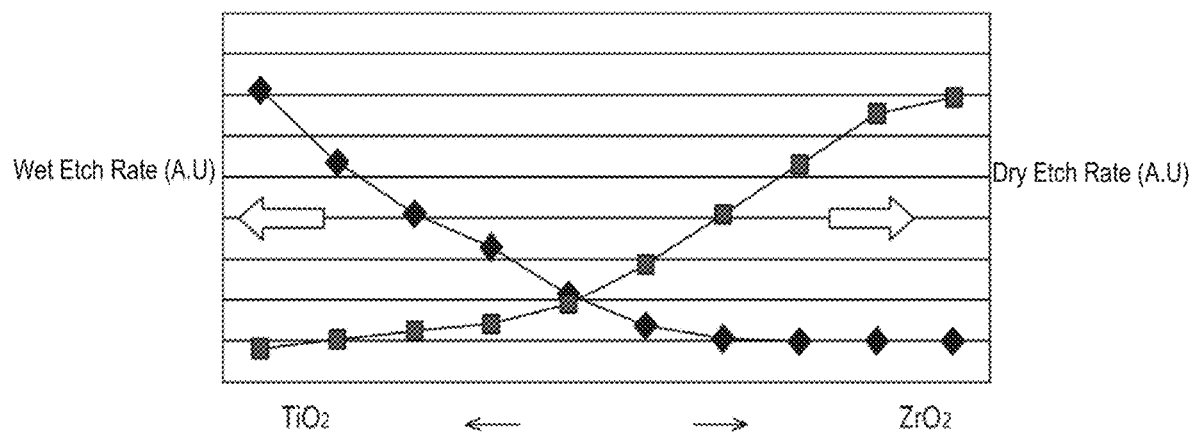
FIG. 9 is a graph showing the characteristic correlation between wet etch rate (WER) and dry etch rate (DER) as a function of the ratio of components in a multilayer structure according to an embodiment of the present invention.

FIG. 9 is a graph showing the correlation between wet etch rate (WER) and dry etch rate (DER) as a function of the ratio of components in a multilayer structure according to an embodiment of the present invention. This experiment was also performed using a zirconium oxide ($ZrO_2$) layer as a first material layer and a titanium oxide ($TiO_2$) layer as a second material layer.

Referring to FIG. 9, it was observed that the dry etch rate of the multilayer structure had a tendency to increase as the proportion of the zirconium oxide ($ZrO_2$) layer that is the first material layer of the multilayer structure increased. Meanwhile, it was observed that the wet etch rate had a tendency to become higher as the proportion of the titanium oxide ($TiO_2$) layer that is the second material layer increased.

Here, the fact that the wet etch rate is high means that the multilayer structure can be easily removed after functioning as a mask layer.

Therefore, as can be seen from the graph, adjustment of the ratio of the first component to the second component makes it possible not only to adjust the dry etch rate of the multilayer structure, but also to easily adjust the wet etch rate.

Figure 10:
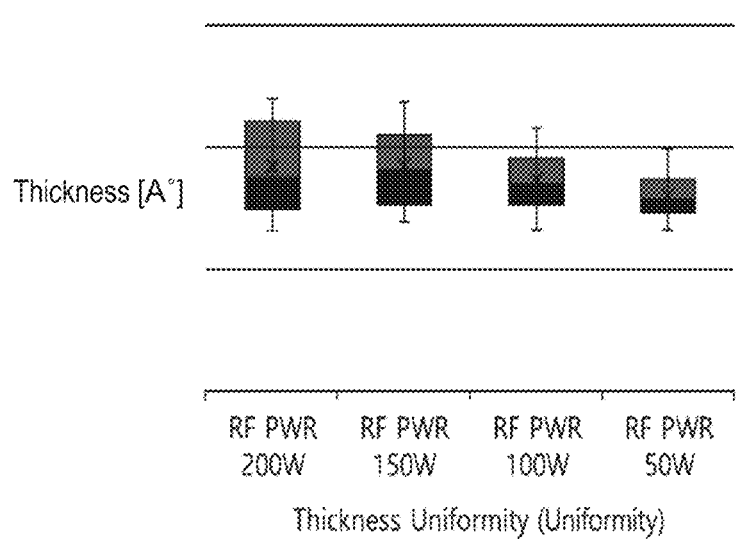
FIG. 10 is a graph showing thickness uniformity as a function of RF power during deposition of a multilayer structure according to an embodiment of the present invention.

FIG. 10 is a graph showing thickness uniformity as a function of RF power during deposition of a multilayer structure according to an embodiment of the present invention.

In the experiment shown in FIG. 10, a change in the deposited thickness of the multilayer structure of the embodiment was measured while changing an RF power for generating plasma from 200 W to 150 W, 100 W and 50 W, during deposition of the multilayer structure by the PEALD method.

From the experimental results, it was observed that the change in the thickness of the multilayer structure become smaller as the RF power become lower. Accordingly, it is preferable to apply an RF power ranging from 50 W to 300 W during deposition of the multilayer structure, in order to ensure the thickness uniformity of the multilayer structure.

Figure 11:
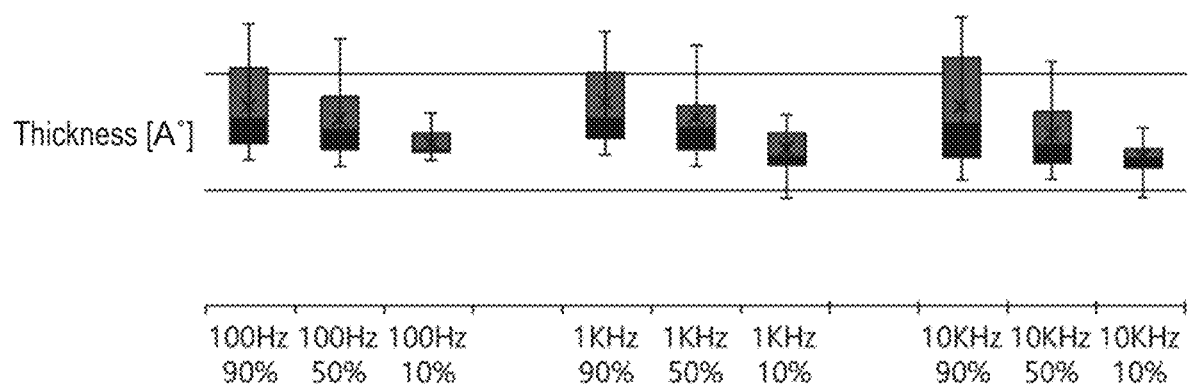
FIG. 11 is a graph showing the thickness uniformity of a multilayer structure according to an embodiment of the present invention with changes in frequency and plasma application method (the proportion of plasma applied in pulses) during deposition of the multilayer structure.

FIG. 11 is a graph showing the thickness uniformity of a multilayer structure according to an embodiment of the present invention with changes in frequency and plasma application method (the proportion of plasma applied in pulses) during deposition of the multilayer structure.

In the experiment shown in FIG. 11, the change in the thickness of the multilayer structure with changes in pulse frequency for plasma generation and duty time (e.g., proportion of plasma applied) during deposition of the multilayer structure was measured.

Referring to FIG. 11, it was observed that when the pulse frequency was changed from 100 Hz to 1 KHz and 10 KHz bands at the same plasma duty time, the difference in the thickness of the multilayer structure between the respective frequency bands was not significant.

On the other hand, it was observed that when the plasma duty time was changed from 10% to 50% and 90% at the same frequency band, the thickness uniformity of the multilayer structure significantly changed depending on the plasma duty time.

From these experimental results, it can be predicted that when the plasma duty time is adjusted to the range of 10 to 50% in a state in which a pulse frequency of 100 Hz to 10 KHz is applied, excellent thickness uniformity can be obtained.

Figure 12:
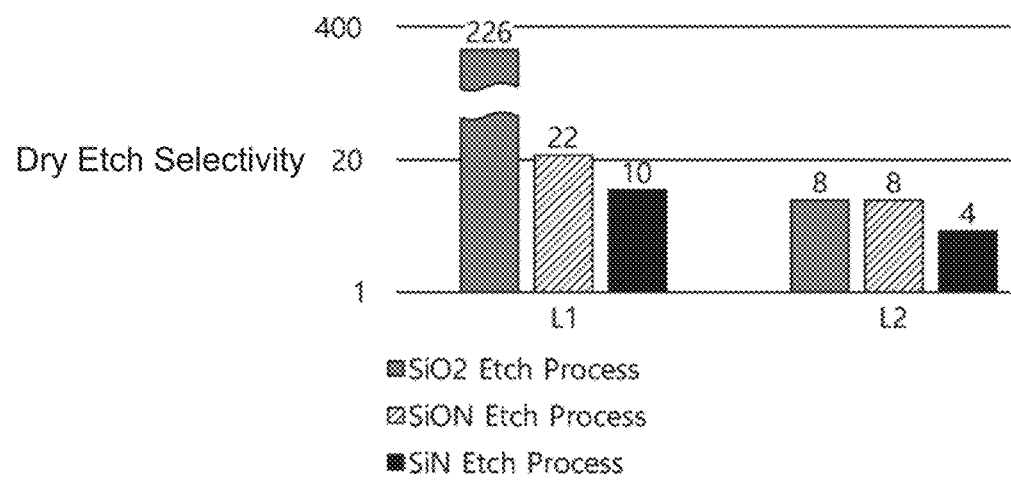
FIG. 12 is a graph showing the etch selectivities of multilayer structures according to an embodiment of the present invention and individual layers.

FIG. 12 is a graph showing the dry etch selectivities of multilayer structures according to an embodiment of the present invention and individual layers.

In FIG. 12, L1 indicates a first multilayer structure which is composed of a zirconium oxide layer and a titanium oxide layer ($ZrO_2$—$TiO_2$) and in which the content ratio between zirconium (Zr) and titanium (Ti) is 88%:12%, and L2 indicates a second multilayer structure which is composed of a zirconium oxide layer and a titanium oxide layer ($ZrO_2$—$TiO_2$) and in which the content ratio between zirconium (Zr) and titanium (Ti) is 13%:87%. In addition, in the experiment shown in FIG. 12, the etch selectivity in a plasma etch process was measured.

Referring to FIG. 12, the first multilayer structure (L1) and the silicon oxide layer ($SiO_2$) were measured to have an etch selectivity of 1:226 when etched using an etching gas for the silicon oxide layer ($SiO_2$). Furthermore, the first multilayer structure (L1) and the silicon oxynitride layer (SiON) were measured to have an etch selectivity of 1:22 when etched using an etching gas for the silicon oxynitride layer (SiON). In addition, the first multilayer structure (L1) and the silicon nitride layer (SiN) were measured to have an etch selectivity of 1:8 when etched using an etching gas for the silicon nitride layer (SiN).

Meanwhile, the second multilayer structure (L2) and the silicon oxide layer ($SiO_2$) were measured to have an etch selectivity of 1:8 when etched using an etching gas for the silicon oxide layer ($SiO_2$). Furthermore, the second multilayer structure (L2) and the silicon oxynitride layer (SiON) were also measured to have an etch selectivity of 1:8 when etched using an etching gas for the silicon oxynitride layer (SiON). In addition, the second multilayer structure (L2) and the silicon nitride layer (SiN) were measured to have an etch selectivity of 1:4 when etched using an etching gas for the silicon nitride layer (SiN).

From these experimental results, it can be seen that the first and second multilayer structures L1 and L2 may have an etch selectivity of at least 1:4 with respect to the silicon oxide layer ($SiO_2$), the silicon oxynitride layer (SiON) and the silicon nitride layer (SiN), which are typical dielectric layers.

In addition, the fact that the first and second multilayer structures L1 and L2 have excellent etch selectivity as described above in the plasma etch processes in which strong energy is irradiated suggests that the first and second multilayer structures L1 and L2 have better hardness characteristics than common dielectric layers. Accordingly, they may be used as spacers, hard mask layers and etch stoppers.

Figure 13:
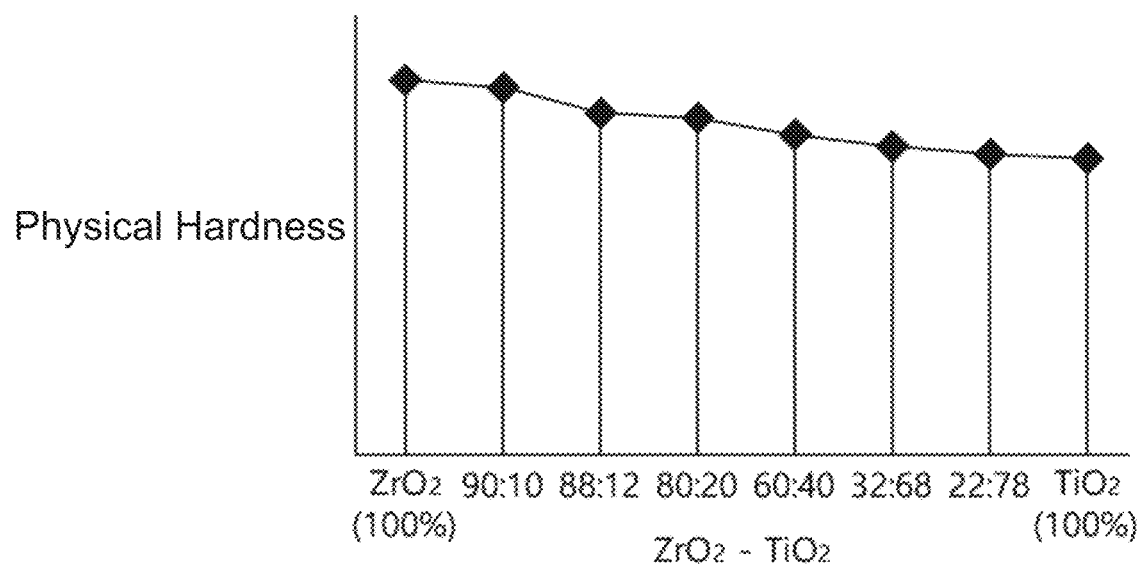
FIGS. 13 and 14 are graphs showing the hardness characteristics of a multilayer structure according to an embodiment of the present invention as a function of the ratio of components in the multilayer structure.
Figure 14:
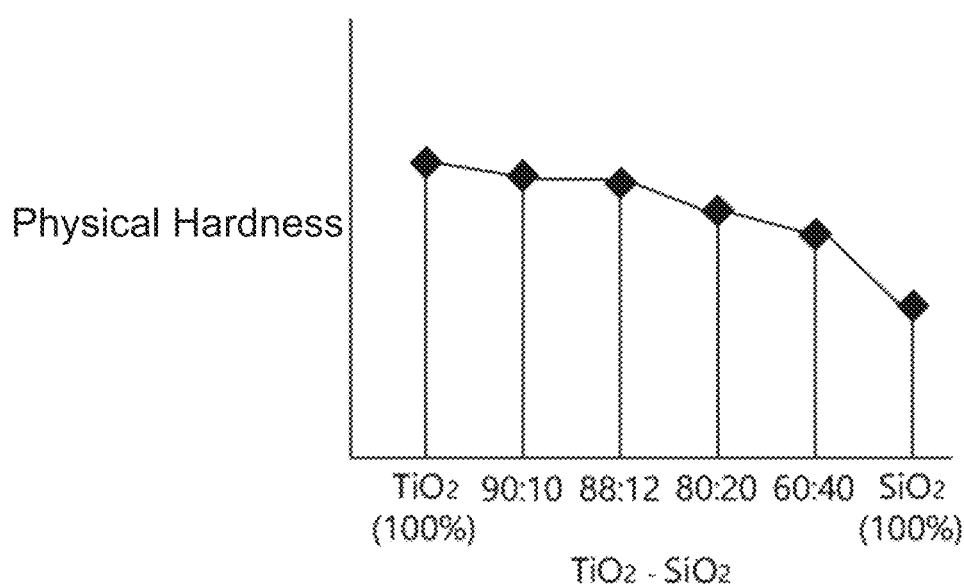

FIGS. 13 and 14 are graphs showing the hardness characteristics of a multilayer structure according to an embodiment of the present invention as a function of the ratio of components in the multilayer structure.

FIG. 13 shows the hardness characteristics of a multilayer structure composed of a zirconium oxide layer ($ZrO_2$) and a titanium oxide layer ($TiO_2$) as a function of the content ratio between zirconium (Zr) and titanium (Ti). Referring to FIG. 13, it can be seen that the hardness of the multilayer structure increases as the content of zirconium (Zr) increases.

FIG. 14 shows the hardness characteristics of a multilayer structure composed of a silicon oxide layer ($SiO_2$) and a titanium oxide layer ($TiO_2$) as a function of the content ratio between silicon (Si) and titanium (Ti). Referring to FIG. 14, it can be seen that the hardness of the multilayer structure increases as the content of titanium (Ti) increases.

MODE FOR INVENTION

FIGS. 15a to 15d are process sectional views illustrating a method of forming a fine pattern according to an embodiment of the present invention.

Currently, semiconductor integrated circuit devices are fabricated using fine mask patterns having a line width equal to or smaller than the exposure limit, and the fine mask patterns are defined by a double patterning mask technique or a spacer mask technique. Since the fine mask patterns should maintain a line width equal to or smaller than the exposure limit, roughness characteristics and high etch selectivity characteristics should be simultaneously ensured. More specifically, currently, fine mask patterns are required to have a line width of 10 nm or less, and thus when high surface roughness (e.g., 2 Å or more) occurs, it makes it difficult to achieve the function of the fine patterns. Since the fine mask patterns have a narrow line width, etch selectivity with respect to an etching target layer is very important. Namely, if etch selectivity characteristics of the fine mask pattern are not ensured, the fine mask pattern will be removed simultaneously with etching of the etching target layer, and for this reason, etch selectivity and thickness uniformity should be ensured together with the roughness characteristics.

In this embodiment, a fine mask pattern is fabricated using a multilayer structure with an optimal content ratio and optimal process conditions, determined based on the experimental conditions described above with reference to FIGS. 7 to 14.

Figure 15A:
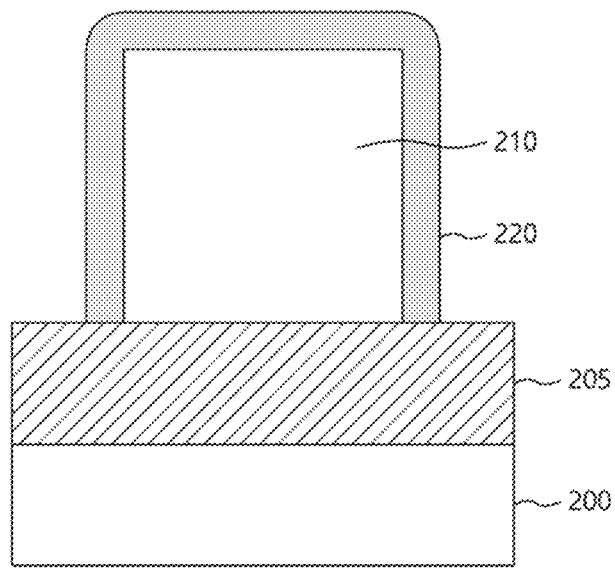
FIGS. 15A to 15D are process sectional views illustrating a method of forming a fine pattern according to an embodiment of the present invention.

Referring to FIG. 15a, an etching target layer 205 is deposited on a semiconductor substrate 200. The etching target layer 205 may be a silicon oxide layer, a silicon nitride layer, a silicon oxynitride layer, or a combination thereof. On the etching target layer 205, a sacrificial pattern 210 may be formed. The sacrificial pattern 210 may be formed of a material that can be more easily removed than the etching target layer 205. Here, the line width of the sacrificial pattern 210 may be the spacing between fine patterns to be formed later.

On the etching target layer 205 having the sacrificial pattern 210 formed thereon, a multilayer structure 220 is formed. The multilayer structure 220 may be formed using the structure and fabrication method shown in FIGS. 1A to 5C. For example, when the first component of the multilayer structure 220 is zirconium (Zr) and the second component thereof is titanium (Ti), the multilayer structure 220 may have a zirconium/titanium content ratio of about 90%:10% to 7%:93% or 90%:10% to 88%:12%. In addition, when the first component is silicon (Si) and the second component is titanium (Ti), the multilayer structure 220 may have a silicon/titanium content ratio of about 70%:30% to 20%:80%. This content ratio may be adjusted depending on the number of the first and second atomic layers deposited. Furthermore, the multilayer structure 220 may be deposited by PEALD at a temperature ranging from 50° C. to 300° C.

In addition, for the PEALD, the pulse frequency may be set to a range of 100 Hz to 10 kHz, the plasma pulse duty time may be set to a range of 10 to 50%, and the RF power may be set to a range of 50 W to 300 W.

The thickness of the multilayer structure 220 may be determined in consideration of the line width of a fine pattern to be formed later. In addition, the multilayer structure 220 may be deposited in atomic layer units by the above-described ALD method, and thus may be deposited as a thin layer having a thickness of 10 nm or less.

Figure 15B:
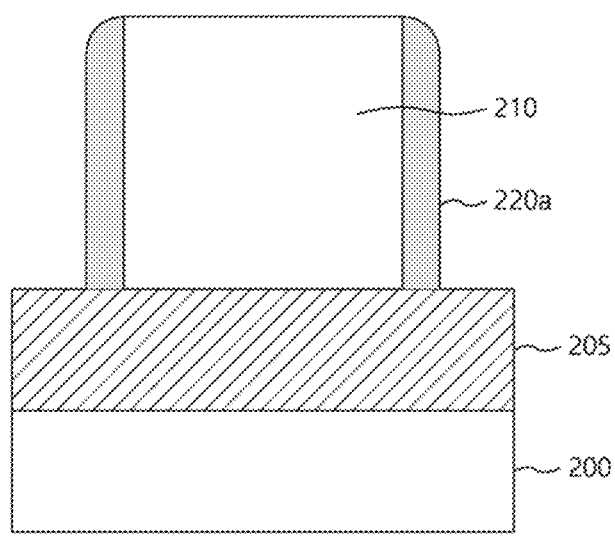

Referring to FIG. 15b, the multilayer structure 220 is anisotropically etched to expose the surface of the sacrificial pattern 210, thereby forming a spacer 220a on both lateral sides of the sacrificial pattern 210.

Figure 15C:
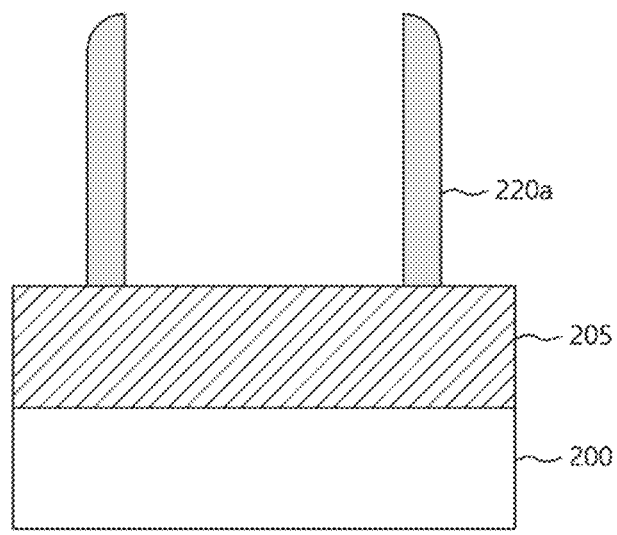

Referring to FIG. 15c, the sacrificial pattern 210 is selectively removed. Accordingly, only the spacer 220a remains.

Figure 15D:
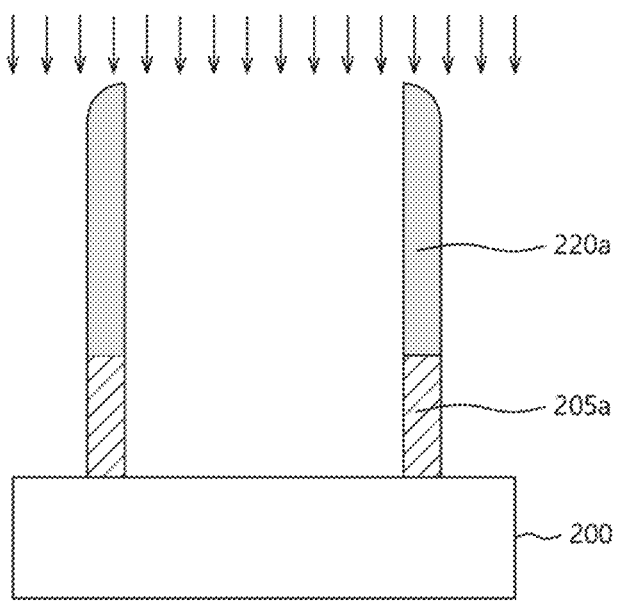

Referring to FIG. 15d, the exposed etching target layer 205 is etched using the spacer 220a, thereby forming a pattern 205a having a fine line width.

Thereafter, although not shown in the figures, the spacer 220a is selectively removed using a publicly known method.

INDUSTRIAL APPLICABILITY

As described above in detail, according to the present invention, a multilayer structure having all desired surface roughness characteristics, etch selectivity characteristics and hardness characteristics may be fabricated by adjusting the content ratio between the components in the multilayer structure.

Although the exemplary embodiments of the present invention have been described in detail, the present invention is not limited to these embodiments, and those skilled in the art will appreciate that various modifications are possible without departing from the technical spirit of the present invention.

The invention claimed is:

1. A method for fabricating a multilayer structure for a hard mask, comprising the steps of:
    depositing a first material layer comprising at least one atomic layer by using a first source gas, which comprises a first component, and an oxygen-containing reactive gas which is reactive with the first source gas; and
    depositing, on the first material layer, a second material layer comprising at least one atomic layer by using a second source gas, which comprises a second component different from the first component, and an oxygen-containing reactive gas which is reactive with the second source gas,
    wherein the step of depositing the first material layer and the step of depositing the second material layer constitute one deposition cycle, and the deposition cycle is performed at least once,
    wherein a content ration between the first source gas and the second source gas is determined in range in which crystallization do not occur in the first material layer and the second material layer, and
    wherein the first source gas is a gas comprising one selected from among zirconium (Zr) and titanium (Ti), and the second source gas is a gas comprising the other one of zirconium (Zr) and titanium (Ti).

2. The method of claim 1, wherein the gas comprising zirconium (Zr) is a Cp-Zr (cyclopentadienyl tris(dimethylamino)zirconium; formula: $CpZr[N(CH_3)_2]_3$), ethylcyclopentadienyl tris(ethylmethylamino)zirconium (formula:

$((C_2H_5)C_5H_4)Zr[N(CH_3)C_2H_5]_3)$, TEMA-Zr (tetrakis(ethylmethylamino)zirconium; formula: $Zr[N(CH_3)(C_2H_5)]_4$), or $ZrCl_4$ (zirconium tetrachloride) source.

3. The method of claim 1, wherein the gas comprising titanium (Ti) is a CP—Ti (Cyclopentadienyl Titanium(IV) Triethoxide: C11H20O3Ti), TEMA-Ti (tetrakis(ethylmethylamino)titanium; formula: $Ti[N(CH_3)(C_2H_5)]_4$), TTIP (titanium tetraisopropoxide; formula: $Ti[O(CH(CH_3)_2)]_4$), $TiCl_4$ (titanium tetrachloride) or TDMAT (tetrakis(dimethylamino)titanium; formula: $Ti[N(CH_3)_2]_4$) source.

4. The method of claim 1, wherein a content ratio between zirconium (Zr) and titanium (Ti) in the multilayer structure is 90%:10% to 7%:93%.

5. The method of claim 1, wherein a content ratio between zirconium (Zr) and titanium (Ti) in the multilayer structure is 90%:10% to 88%:12%.

6. The method of claim 1, wherein the reactive gas is one selected from among oxygen ($O_2$), ozone ($O_3$) and water ($H_2O$).

7. The method of claim 1, wherein the first material layer and the second material layer are each formed at a temperature ranging from 50° C. to 300° C.

8. The method of claim 1, wherein the first material layer and the second material layer are formed by any one method selected from among a thermal atomic layer deposition (ALD) method, a plasma-enhanced ALD (PEALD) method, and a combination thereof.

9. The method of claim 8, wherein, when at least one of the first material layer and the second material layer is deposited by the thermal ALD method, any one of $O_3$ and $H_2O$ is supplied as the reactive gas.

10. The method of claim 8, wherein, when at least one of the first material layer and the second material layer is deposited by the PEALD method, $O_2$ is supplied as the reactive gas.

11. The method of claim 8, wherein, when at least one of the first material layer and the second material layer is deposited by the PEALD method, plasma is applied continuously during a period in which the first component or the second component reacts with the reactive gas.

12. The method of claim 8, wherein, when at least one of the first material layer and the second material layer is deposited by the PEALD method, plasma is applied in a pulse form during a period in which the first component or the second component reacts with the reactive gas.

13. The method of claim 8, wherein, when at least one of the first material layer and the second material layer is deposited by the PEALD method, an RF power of 50 W to 300 W is applied for plasma generation.

14. The method of claim 8, wherein at least one of the first material layer and the second material layer is deposited by a pulsed PEALD method in which plasma is applied in a pulse form, and for application of the plasma, an RF power of 50 to 300 W is applied, and then pulse frequency is set to a range of 100 Hz to 10 kHz, and plasma pulse duty time is set to a range of 10 to 50%.

15. The method of claim 1, wherein the gas comprising titanium (Ti) is a CP—Ti (Cyclopentadienyl Titanium (IV) Triethoxide: C11H20O3Ti), TEMA-Ti (tetrakis(ethylmethylamino)titanium; formula: $Ti[N(CH_3)(C_2H_5)]_4$), TTIP (titanium tetraisopropoxide; formula: $Ti[O(CH(CH_3)_2)]_4$), $TiCl_4$ (titanium tetrachloride) or TDMAT (tetrakis(dimethylamino)titanium; formula: $Ti[N(CH_3)_2]_4$) source.

16. The method of claim 1, further comprising: an annealing the first material layer and the second material layer to form a multilayer,
wherein the multilayer does not have a crystallinity after the anneal is performed.

* * * * *